United States Patent
Hopper et al.

(10) Patent No.: US 7,023,068 B1
(45) Date of Patent: Apr. 4, 2006

(54) METHOD OF ETCHING A LATERAL TRENCH UNDER A DRAIN JUNCTION OF A MOS TRANSISTOR

(75) Inventors: Peter J. Hopper, San Jose, CA (US); Philipp Lindorfer, San Jose, CA (US); Vladislav Vashchenho, Palo Alto, CA (US); Peter Johnson, Sunnyvale, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 54 days.

(21) Appl. No.: 10/716,277

(22) Filed: Nov. 17, 2003

(51) Int. Cl.
*H01L 29/00* (2006.01)
*H01L 21/336* (2006.01)

(52) U.S. Cl. ............... 257/510; 257/627; 438/198; 438/296

(58) Field of Classification Search ........ 257/401, 257/506, 510, 522, 513–515, 627; 438/198, 438/294, 296, 421, 422, 424, 733, 973
See application file for complete search history.

(56) References Cited

U.S. PATENT DOCUMENTS

| | | | | |
|---|---|---|---|---|
| 4,523,213 A | * | 6/1985 | Konaka et al. | 257/347 |
| 4,638,552 A | * | 1/1987 | Shimbo et al. | 438/455 |
| 4,685,198 A | * | 8/1987 | Kawakita et al. | 438/410 |
| 6,404,034 B1 | * | 6/2002 | Widmann et al. | 257/520 |
| 6,429,091 B1 | * | 8/2002 | Chen et al. | 438/423 |
| 6,621,123 B1 | * | 9/2003 | Nakabayashi et al. | 257/347 |
| 6,830,980 B1 | * | 12/2004 | Mansoori et al. | 438/308 |

* cited by examiner

*Primary Examiner*—Mark V. Prenty
(74) *Attorney, Agent, or Firm*—Jurgen Vollrath

(57) ABSTRACT

In a MOS transistor, the drain capacitance is reduced by forming a lateral trench underneath the drain. This is typically done by using an anisotropic wet etch process in a <110> direction of a <100> orientation wafer.

8 Claims, 3 Drawing Sheets

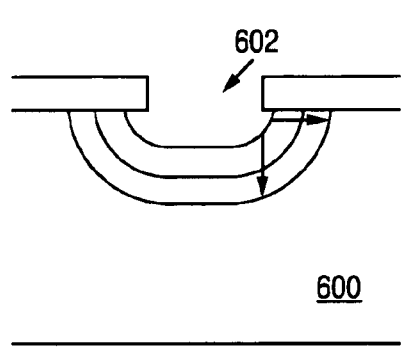
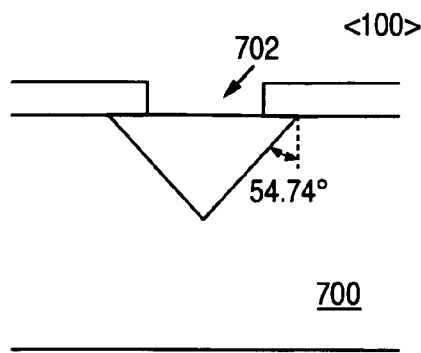
FIG. 6
(PRIOR ART)
FIG. 7
(PRIOR ART)
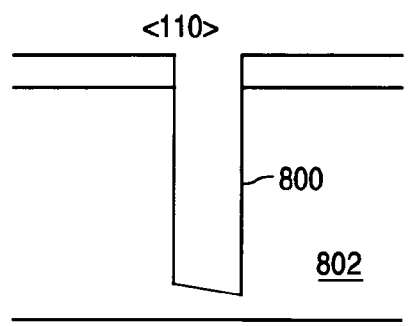
FIG. 8
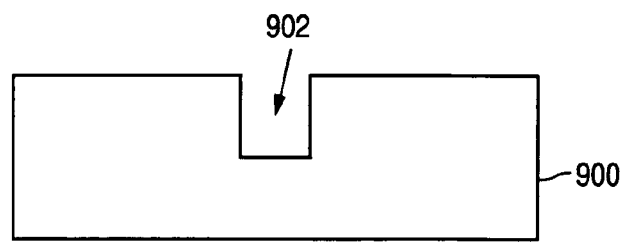
FIG. 9
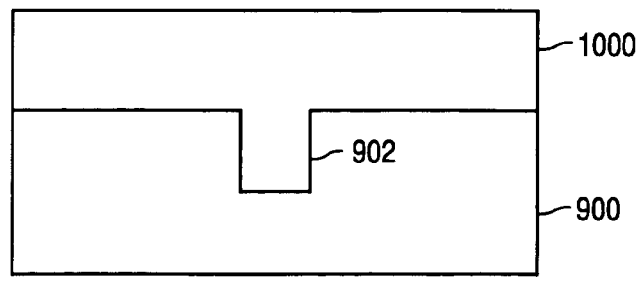
FIG. 10

METHOD OF ETCHING A LATERAL TRENCH UNDER A DRAIN JUNCTION OF A MOS TRANSISTOR

FIELD OF THE INVENTION

The invention relates to MOS transistor. In particular, it relates to a MOS transistor with reduced drain capacitance.

BACKGROUND OF THE INVENTION

A typical MOS transistor, as indicated by reference numeral 100 in FIG. 1, includes a drain region 102, and a source region 104, formed in a substrate 106, and separated by a channel region 108. A metal gate 110 serves as the controlling electrode. For ease of description, the metal contacts to the drain region 102 and source region 104, have not been shown, but would serve to provide electrical contact with the drain and source regions, in a manner commonly known in the art. It will be appreciated that the drain 102 is oppositely doped to the substrate 106 and that a reverse biased p-n junction exists between the drain region 102 and substrate 106, which accounts for a substantial amount of drain capacitance.

It will be appreciated that this parasitic capacitance has a significant effect on fMax (the maximum frequency at which the device can practically be operated) and fT (the cut-off frequency where voltage gain is unity). It would therefore be desirable to be able to increase fMax and fT for high speed applications.

SUMMARY OF THE INVENTION

The present invention proposes a MOS transistor with reduced drain capacitance comprising a drain and a source formed in a substrate, at least one vertical trench for lateral isolation, and a lateral trench extending at least partly under the drain, which may me filled with air or an insulator. The vertical trench requires a <110> sidewall orientation in a <100> silicon wafer.

For purposes of this application, drain and source are used interchangeably with the terms drain region and source region. Also, the term substrate is used generically for any material in which the drain and source are formed, whether or not that is a well or the underlying substrate.

Further, according to the invention, there is provided a method of forming a laterally extending trench underneath the drain of a MOS transistor, comprising making use of the natural crystal orientation for the semiconductor material in which the BJT is formed and accordingly choosing a predetermined crystal configuration, and using an anisotropic etchant to etch the trench. The semiconductor material may be silicon and the crystal configuration is preferably a standard <100> configuration. The laterally extending trench therefore preferably has an orientation of <110>. The etchant is preferably a wet anisotropic silicon etchant such as KOH, typically with alcohol such as ethanol, and water. It may also be another type of wet anisotropic etchant such as TMAH.

BRIEF DESCRIPTION OF THE DRAWINGS

FIG. 6 shows a typical isotropic etch profile, FIG. 7 shows a typical anisotropic etch profile in a <100> direction, FIG. 8 shows a typical anisotropic etch profile in a <110> direction, and FIGS. 9–16 show the steps of forming a laterally extending isolation trench in accordance with one embodiment of the invention.

DETAILED DESCRIPTION OF THE INVENTION

Figure 1:
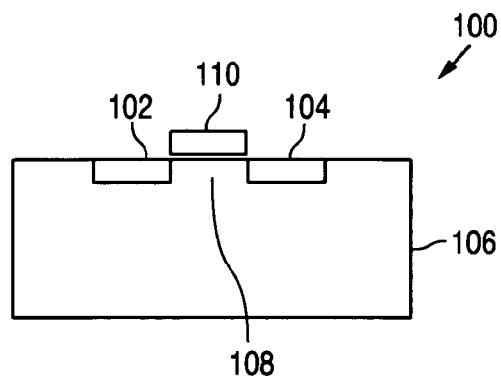
FIG. 1 is a section through a typical MOS transistor in an integrated circuit.
Figure 2:
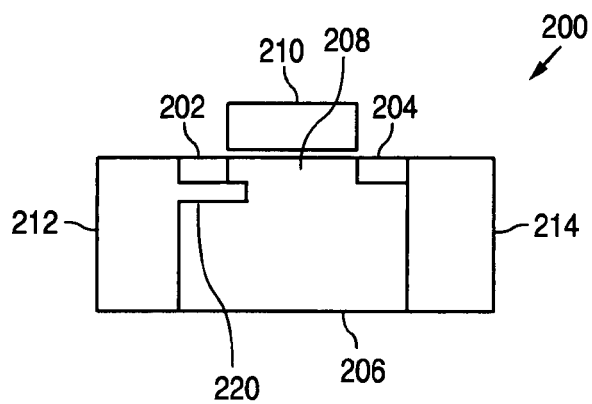
FIG. 2 is a section through a one embodiment of a MOS transistor of the invention.

It has been determined that by providing an isolation region between the extrinsic base and the collector of a BJT, the base-collector parasitic capacitance can be improved to achieve an improved fMax and fT for the BJT device. In order to achieve this, one approach adopted by the applicants as part of the present invention is to etch a laterally extending trench underneath the drain, which extends at least partially under the drain. One such embodiment is illustrated in FIG. 2 which shows a MOS transistor 200 having a drain 202 and a source 204 formed in a substrate 206, and separated by a channel region 208 under a gate 210. In addition vertically extending shallow trench isolation regions (STIs) 212, 214 are formed next to the drain 202 and source d204, respectively as shown. In accordance with the invention a lateral trench 220 is formed underneath the drain 202, extending from the vertical STI 212 to act as an isolation region underneath the drain 202 and thereby reduce the drain capacitance. In the present embodiment the lateral trench 220 extends entirely underneath the drain 202 and even somewhat past the drain region 220. It will be appreciated that other embodiments may have the lateral trench extending only partially underneath the drain thereby only partially limiting the drain capacitance.

Another aspect of the invention relates to the manner in which the laterally extending isolation regions, such as the trench 220 in FIG. 2 are formed. The present invention makes use of the natural crystal orientation of the semiconductor material in which the transistor is formed, and a specific etchant type to achieve the desired configuration of the laterally extending trench underneath the drain.

Figure 3:
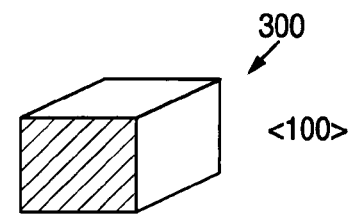
FIGS. 3–5 show three crystal orientations.
Figure 4:
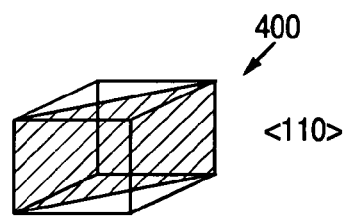
Figure 5:
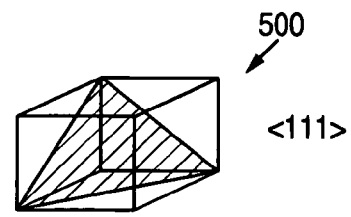

Crystals, such as silicon crystals, have a particular configuration that is determined by the way the atoms in the crystal are aligned. For ease of reference, terminology has evolved to define three basic configurations: <100><110><111>. These are best understood with reference to FIGS. 3, 4 and 5, respectively. This is discussed in more detail in "Physics of Semiconductor Devices" by S. M. Sze (see in particular on page 10), which is incorporated by reference herein. Typically BJTs are formed in silicon wafers that are grown to have a crystal orientation of <111> for the top surface. In contrast MOS and BiCMOS devices are typically formed in <100> orientation wafers (in the case of BiCMOS SiGe is typically used). The present invention proposes using a <100> silicon wafer (top surface having a <100> crystal orientation) and forming the laterally extending isolation trenches between the extrinsic base regions and collector in a <110> direction. By doing this in conjunction with an anisotropic etch process, the desired isolation trench, such as the trench 220 was found to be achievable. In particular, in one embodiment, an anisotropic wet etch using KOH with alcohol and water was found to work well. In this embodiment ethanol was used for the alcohol. In another embodiment TMAH was used as the wet anisotropic etchant.

FIG. 6 shows the typical etch profile for isotropic etchants. As can be seen, etching the silicon 600 through a window 602 results in substantially similar etching in the vertical and the lateral directions. FIG. 7 contrasts this with the use of a wet anisotropic etchant such as KOH with alcohol and water when etching through a window 702 in a silicon wafer 700 having a <100> crystal orientation. This provides an etch profile where the trench has an angle of 54.74° as shown in FIG. 7. However, when combining the wet anisotropic etchant with a crystal orientation <110> a trench with very steep vertical sides and negligible lateral etching is achieved as shown in FIG. 8. FIG. 8 shows a deep, narrow trench 800 formed in a silicon wafer 802 having a <110> orientation.

Using this concept, the present invention makes use of a <100> orientation wafer, thereby having the <110> crystal orientation in both the lateral and vertical directions with respect to the wafer flat or notch. Thus, the rectangular mask opening, used to form the vertical trench is formed such that its rectangular opening, in the plane of the wafer, is oriented similarly, either perpendicular or parallel to the wafer flat or notch. This allows deep lateral trenches to be etched using a wet anisotropic etchant. Preferably a plasma/dry etch is used for etching the vertical trench.

The process of forming one embodiment of a MOS transistor of the invention will now be discussed in more detail with respect to FIGS. 9–16.

FIG. 9 shows a silicon substrate 900 having a <100> orientation. A shallow trench 902 is etched into this substrate using, standard techniques for forming a shallow trench isolation (STI) region. As will become clearer below, the trench 902, will ultimately serve to form the STI regions 212 next to the drain.

An organic fill material 1000 such as BCB, polyamide, Perspex, etc, is then deposited on the silicon 900 to fill the trench 902, as shown in FIG. 10.

Figure 11:
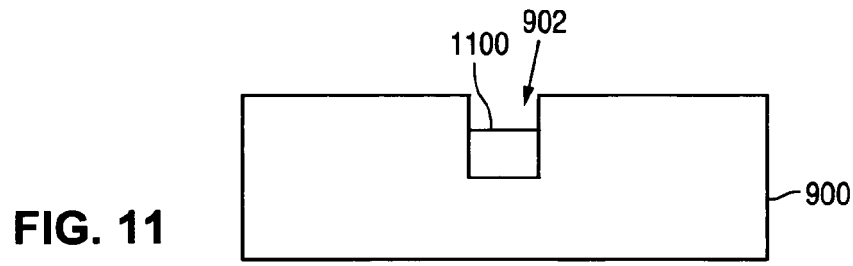

As shown in FIG. 11, the organic fill 1000 is then etched back to leave an organic fill plug 1100 in the bottom of the trench 902. Preferably an oxygen based plasma is used for etching back the organic fill.

Figure 12:
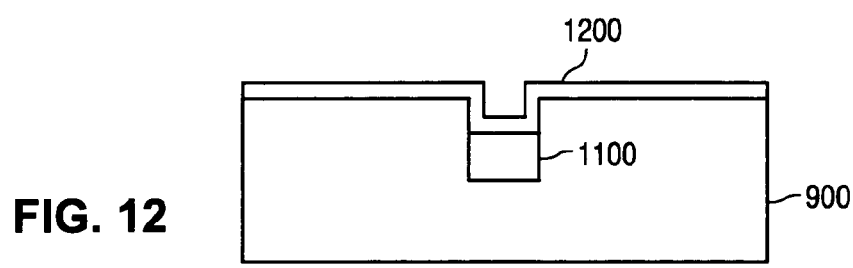
Figure 13:
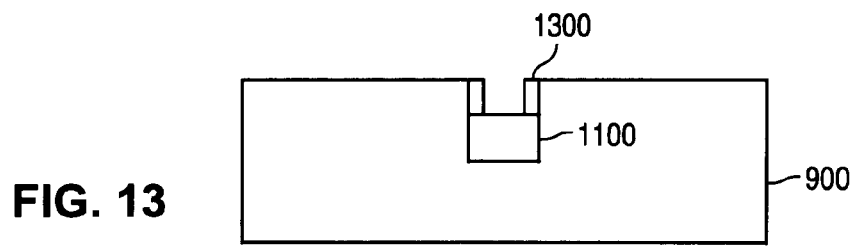

A plasma enhanced TEOS (PETEOS) 1200 is then deposited as shown in FIG. 12, whereafter the excess PETEOS is etched away, leaving a spacer sidewall, as shown in FIG. 13. In this embodiment a reactive ion etch (RIE) was used to etch away the excess PETEOS to leave the PETEOS spacer 1300.

Figure 14:
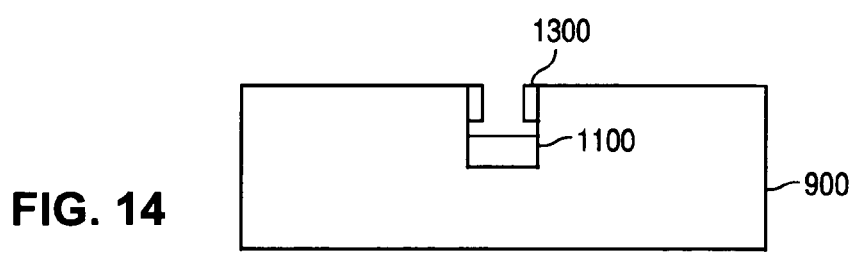

Thereafter, more of the organic fill plug 1100 is etched away using, for example, $O_2$ plasma or wet etch. This is shown in FIG. 14, and leaves a short lateral undercut under the PETEOS spacer 1300.

Figure 15:
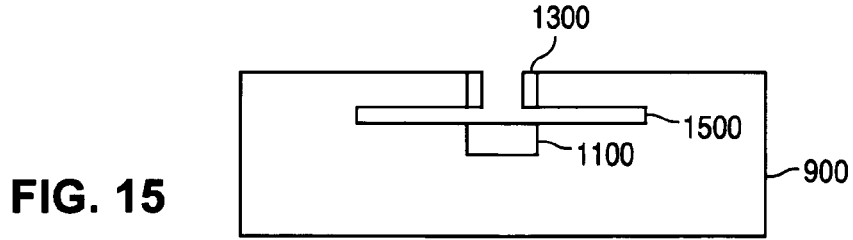

Thereafter, the laterally extending trench 1500 is etched in the <110> direction by making use of an anisotropic wet etch such as KOH with ethanol and water, or TMAH, etc. This is shown in FIG. 15. The one side of the trench 1500 will serve to form an isolation trench under one MOS transistor, such as the trench 220, while the other side of the trench 1500 will be used to form a lateral isolation trench for an adjacent MOS structure. It will be appreciated that, in such a case the drains of the two adjacent transistors will be separated by the STI that will be formed in the trench 902, e.g. the STI 212 in FIG. 2. Even though FIG. 2 shows only the one transistor, it will be appreciated that the other transistor would extend to the left hand side of the transistor 200.

Figure 16:
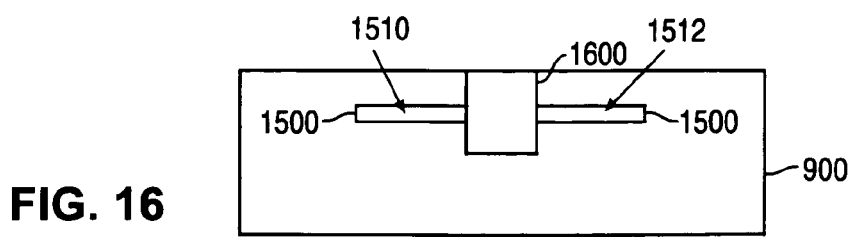

Thereafter, the rest of the organic fill plug is removed, e.g., using an oxygen plasma and cleaning with sulphuric acid or peroxide and followed by dilute HCL or peroxide. Thereafter, the resultant vertical trench is filled with insulating material such as PETEOS or other high step coverable insulating material, to define a STI region 1600 as shown in FIG. 16. It will be appreciated that if the vertical trench has a less aggressive aspect ratio, other insulating material with less step coverage can be used instead of PETEOS. The STI region 1600 is similar to the region 212 of the FIG. 2 embodiment. In this embodiment, however, the laterally extending trench 1500 is not filled with insulating material as in the FIG. 2 embodiment but remains as an air gap that will exist underneath the drain that will subsequently be formed. As noted above, the trench 1500 extends on either side of the STI region 1600 in FIG. 16. It will be appreciated that each of these two trenches (indicated as 1510 and 1512) will ultimately extend under a drain of a transistor (the drains being formed in the silicon material 900 in any standard way known in the art).

It will also be appreciated that while the present invention was described with respect to some specific embodiments, different embodiments may be adopted without departing from the scope of the invention as defined by the claims.

What is claimed is:

1. A MOS transistor with reduced drain capacitance comprising
    a drain, and
    a lateral isolation trench extending at least partially underneath the drain, wherein the trench has a <110> orientation.

2. A MOS of claim 1, wherein the trench is formed in a <100> silicon wafer.

3. A method of forming a laterally extending trench in a semiconductor material underneath a drain of a MOS transistor, comprising
    choosing a predetermined crystal orientation,
    etching a vertically extending STI region next to the drain, and
    using an anisotropic etchant to etch a trench extending laterally from the STI, wherein choosing of the crystal orientation includes choosing a lateral trench direction that is in the <110> direction.

4. A method of claim 3, wherein the semiconductor material is silicon.

5. A method of claim 4, wherein the etchant is a wet anisotropic silicon etchant.

6. A method of claim 5, wherein the etchant includes KOH.

7. A method of claim 6, wherein the etchant further includes alcohol and water.

8. A method of claim 5, wherein the etchant includes TMAH.

* * * * *